United States Patent
Ma (10) Patent No.: US 10,403,712 B2
(45) Date of Patent: Sep. 3, 2019

(54) COMBINED GATE TRENCH AND CONTACT ETCH PROCESS AND RELATED STRUCTURE

(71) Applicant: Infineon Technologies Americas Corp., El Segundo, CA (US)

(72) Inventor: Ling Ma, Redondo Beach, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 311 days.

(21) Appl. No.: 15/171,164

(22) Filed: Jun. 2, 2016

(65) Prior Publication Data
US 2017/0352723 A1    Dec. 7, 2017

(51) Int. Cl.
| | |
|---|---|
| H01L 29/06 | (2006.01) |
| H01L 29/10 | (2006.01) |
| H01L 29/66 | (2006.01) |
| H01L 29/49 | (2006.01) |
| H01L 29/78 | (2006.01) |
| H01L 29/739 | (2006.01) |
| H01L 29/45 | (2006.01) |

(52) U.S. Cl.
CPC ........ *H01L 29/063* (2013.01); *H01L 29/0696* (2013.01); *H01L 29/1095* (2013.01); *H01L 29/456* (2013.01); *H01L 29/4941* (2013.01); *H01L 29/66348* (2013.01); *H01L 29/66734* (2013.01); *H01L 29/7397* (2013.01); *H01L 29/7813* (2013.01)

(58) Field of Classification Search
None
See application file for complete search history.

(56) References Cited

U.S. PATENT DOCUMENTS

| | | | |
|---|---|---|---|
| 7,767,526 B1 * | 8/2010 | Lee | H01L 29/78 257/E29.262 |
| 2010/0190307 A1 | 7/2010 | Lee et al. | |
| 2010/0308400 A1 | 12/2010 | Darwish et al. | |
| 2014/0179074 A1 | 6/2014 | Pan et al. | |

FOREIGN PATENT DOCUMENTS

JP    2010109033 A    5/2010

* cited by examiner

*Primary Examiner* — Robert K Carpenter
(74) *Attorney, Agent, or Firm* — Murphy, Bilak & Homiller, PLLC (57) ABSTRACT

A method of forming a semiconductor device, the method comprises forming a gate trench and a contact trench concurrently in a semiconductor substrate using a patterned masking layer, forming a gate conductive filler in the gate trench, forming a deep body region below the contact trench, and forming a contact conductive filler in the contact trench. The method further comprises forming a gate trench dielectric liner in the gate trench, forming a gate trench dielectric liner in the gate trench, and forming an interlayer dielectric layer (IDL) over the gate conductive filler. The method further comprises forming a contact implant at a bottom of the contact trench, and forming a barrier layer in the contact trench.

14 Claims, 11 Drawing Sheets

COMBINED GATE TRENCH AND CONTACT ETCH PROCESS AND RELATED STRUCTURE

BACKGROUND

Power semiconductor devices, such as power metal oxide semiconductor field effect transistors (MOSFETs), have been widely used in power switching devices, such as power supplies, rectifiers, low-voltage motor controllers, and so forth. Power semiconductor devices can be made with a trench topology to enhance power density.

Conventional fabrication processes for manufacturing a trench type power semiconductor device often involve several masks to accommodate forming complex structures, such as gate trenches and contact trenches. Using multiple masks to etch adjacent gate and contact trenches of different dimensions in different steps can be difficult and cause defects due to errors introduced by the mask dimensions and alignments thereof at each masking step. Variations in semiconductor device fabrication can also often lead to variations in device electrical performance such as on-state resistance ($R_{DSon}$) and breakdown voltage.

Accordingly, there is a need to overcome the drawbacks and deficiencies in the art by substantially eliminating device defects in trench type power semiconductor devices while enhancing their electrical performance characteristics.

SUMMARY

The present disclosure is directed to a combined gate trench and contact etch process and related structure, substantially as shown in and/or described in connection with at least one of the figures, and as set forth in the claims.

DETAILED DESCRIPTION

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1:
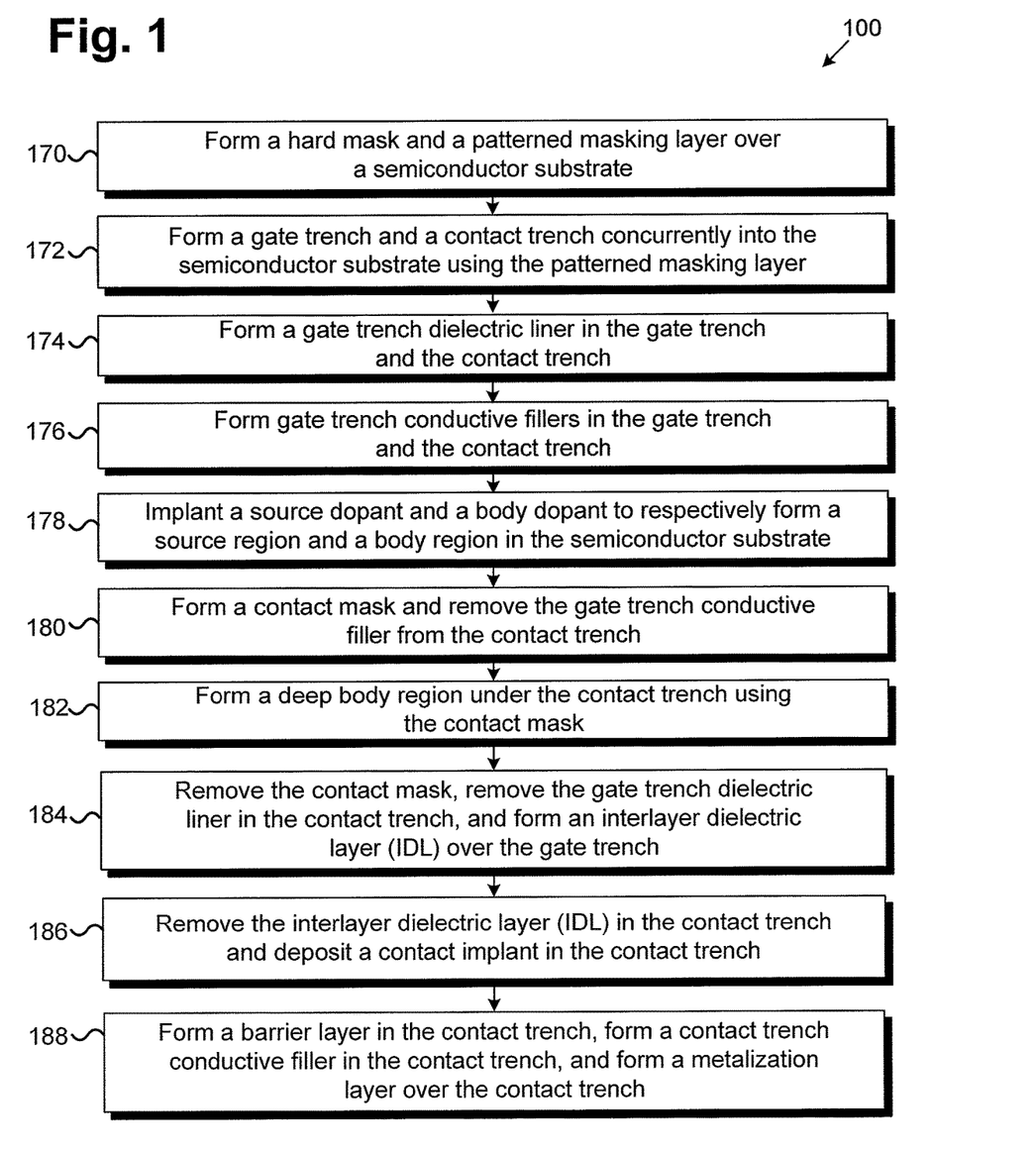
FIG. 1 is a flowchart illustrating a method of forming a semiconductor structure according to one implementation of the present application.

FIG. 1 shows a flowchart illustrating an exemplary method of forming an exemplary semiconductor device according to an implementation of the present application. Certain details and features have been left out of the flowchart that are apparent to a person of ordinary skill in the art. For example, an action may consist of one or more subactions or may involve specialized equipment or materials, as known in the art. Actions 170, 172, 174, 176, 178, 180, 182, 184, 186 and 188 indicated in flowchart 100 are sufficient to describe one implementation of the present inventive concepts, other implementations of the present inventive concepts may utilize actions different from those shown in flowchart 100. Moreover, semiconductor structures 270, 272, 274, 276, 278, 280, 282, 284, 286 and 288 in FIGS. 2A, 2B, 2C, 2D, 2E, 2F, 2G, 2H, 2I and 2J illustrate the results of performing actions 170, 172, 174, 176, 178, 180, 182, 184, 186 and 188 of flowchart 100, respectively. For example, semiconductor structure 270 is an exemplary structure of a portion of a semiconductor device after processing action 170, semiconductor structure 272 is an exemplary structure of a portion of a semiconductor device after the processing of action 172, semiconductor structure 284 is an exemplary structure of a portion of a semiconductor device after the processing of action 174, and so forth.

Figure 2A:
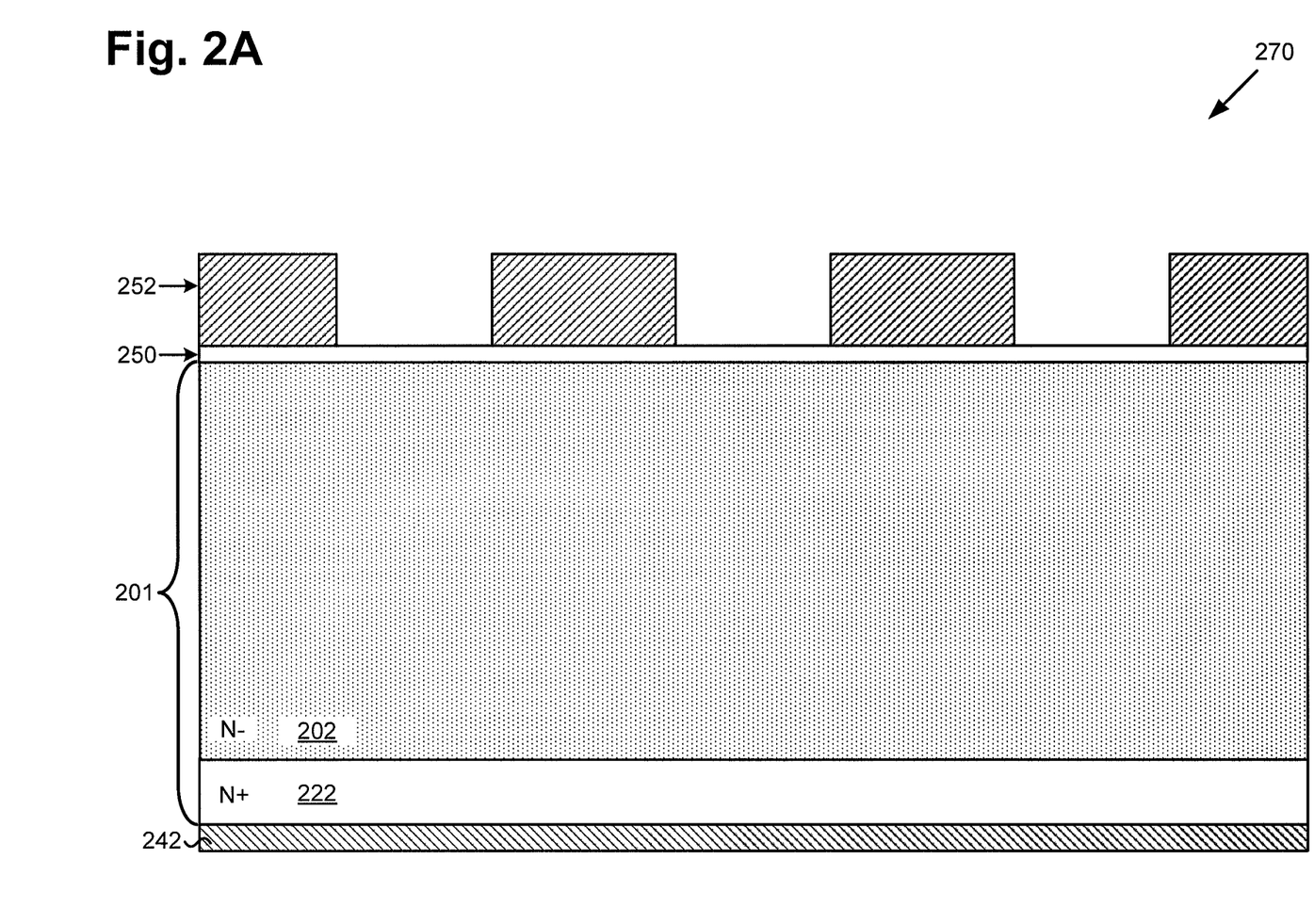
FIG. 2A illustrates a cross-sectional view of a portion of a semiconductor structure processed in accordance with an initial action in the flowchart of FIG. 1 according to one implementation of the present application.

Referring to action 170 in FIG. 1 and semiconductor structure 270 in FIG. 2A, action 170 includes forming a hard mask and a patterned masking layer over a semiconductor substrate. Referring to FIG. 2A, semiconductor structure 270 illustrates a cross-sectional view of a portion of a semiconductor structure after completion of action 170 in flowchart 100 of FIG. 1, according to one implementation of the present disclosure. As illustrated in FIG. 2A, semiconductor structure 270 includes hard mask 250 and patterned masking layer 252 over semiconductor substrate 201.

As illustrated in FIG. 2A, semiconductor substrate 201 includes drift region 202 and drain region 222. Semiconductor substrate 201 may include any suitable semiconductor material, such as silicon. Drift region 202 is situated over drain region 222, which is situated over drain contact layer 242. In the present implementation, drain region 222 includes a highly doped semiconductor material as a drain of a semiconductor device, such as a power MOSFET or an insulated gate bipolar transistor (IGBT). As illustrated in FIG. 2A, drain region 222 is of a first conductivity type, and is shown as having N+ conductivity by way of example. In the present implementation, drain region 222 may include an N type dopant, such as phosphorus or arsenic. In another implementation, drain region 222 may include a P type dopant, such as boron. Drain contact layer 242 is formed at the bottom of drain region 222.

Drift region 202 may include any suitable semiconductor material that can be epitaxially grown (e.g., epitaxial layer) on drift region 202. For example, drift region 202 may include epitaxial silicon grown on drain region 222. As illustrated in FIG. 2A, drift region 202 is of the first conductivity type, and is shown as having N− conductivity by way of example. In one implementation, drift region 202 can be intrinsically or pre-doped to be an N type material, or can be subsequently doped to become an N type material, for example. In the present implementation, drift region 202 may include an N type dopant, such as phosphorus or arsenic. In another implementation, drift region 202 may include a P type dopant, such as boron.

As illustrated in FIG. 2A, hard mask 250 is formed over semiconductor substrate 201. In one implementation, hard mask 250 may include silicon nitride. In one implementation, hard mask 250 may be formed on semiconductor substrate 201 by deposition or nitridation, for example. In another implementation, hard mask 250 may include silicon carbide. Patterned masking layer 252 may be formed on hard mask 250 by deposition or thermal oxidation, for example, and patterned using a trench mask (not explicitly shown in FIG. 2A) to form the patterned openings therein. The thickness of hard mask 250 and the thickness and the widths of the patterned openings of patterned masking layer 252 may be adjusted to suit the specific needs of a particular application.

Figure 2B:
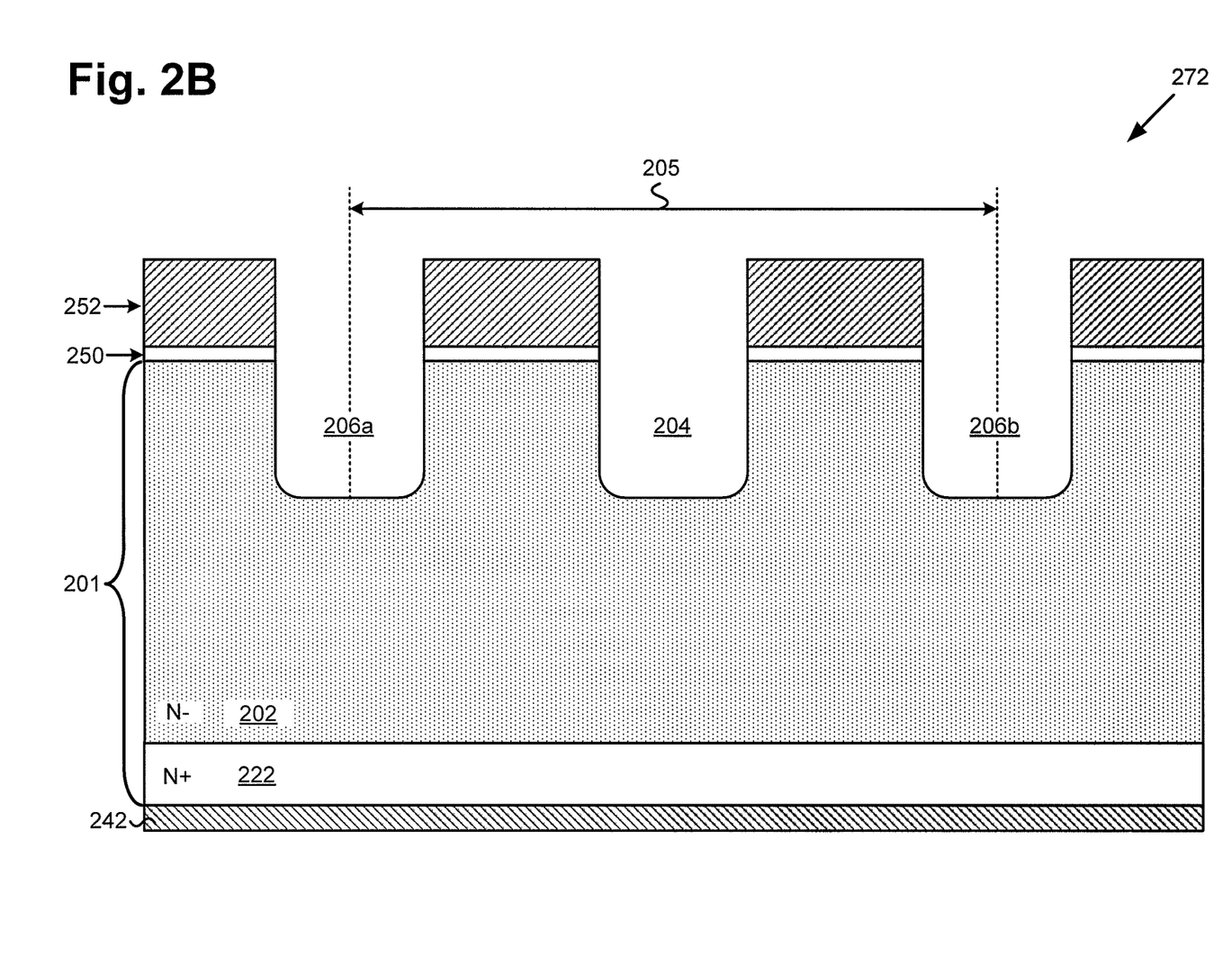
FIG. 2B illustrates a cross-sectional view of a portion of a semiconductor structure processed in accordance with an intermediate action in the flowchart of FIG. 1 according to one implementation of the present application.

Referring to action 172 in FIG. 1 and semiconductor structure 272 in FIG. 2B, action 172 includes forming a gate trench and a contact trench concurrently into the semiconductor substrate using the patterned masking layer. Referring to FIG. 2B, semiconductor structure 272 illustrates a cross-sectional view of a portion of a semiconductor structure after completion of action 172 in flowchart 100 of FIG. 1, according to one implementation of the present disclosure. As illustrated in FIG. 2B, semiconductor structure 272 includes gate trenches 206a and 206b and contact trench 204 extending through hard mask 250 into drift region 202 of semiconductor substrate 201.

In the present implementation, gate trenches 206a and 206b and contact trench 204 may be formed by etching the unmasked regions (e.g., regions not covered by patterned masking layer 252) of drift region 202 using, for example, an anisotropic etch. As illustrated in FIG. 2B, gate trenches 206a and 206b and contact trench 204 extend into drift region 202. Each of gate trenches 206a and 206b and contact trench 204 includes substantially parallel sidewalls extending into a bottom. In the present implementation, gate trenches 206a and 206b and contact trench 204 each include a U-shaped bottom. In another implementation, gate trenches 206a and 206b and contact trench 204 may each include sloped sidewalls and/or a flat bottom.

As illustrated in FIG. 2B, in the present implementation, gate trenches 206a and 206b and contact trench 204 may have substantially the same dimensions (e.g., width and depth). In another implementation, gate trenches 206a and 206b and contact trench 204 may have different dimensions.

It is noted that the width of each of gate trenches 206a and 206b and contact trench 204 may be defined by the respective openings in patterned masking layer 252 formed in action 170. It is also noted that, in semiconductor structure 272, cell pitch 205 which is measured from the center of gate trench 206a and the center of gate trench 206b of sub-micron range. In the present implementation, cell pitch 205 is equal to or less than 0.6 microns. In the present implementation, gate trenches 206a and 206b and contact trench 204 may have a striped layout, where gate trenches 206a and 206b and contact trench 204 are substantially parallel to one another in semiconductor substrate 201. In another implementation, the gate and contact trenches may have a cellular layout.

It is noted that, in contrast to a conventional process for manufacturing trench type semiconductor devices where contact trenches are formed several processing actions after gate conductive fillers are formed in gate trenches, implementations of the present application use a single patterned masking layer (e.g., patterned masking layer 252) to etch both gate trenches 206a and 206b and contact trench 204 in a one-shot trench process. Because the gate and contact trenches are formed in a single processing action, misalignments between the gate and contact trenches can be effectively eliminated, such that a contact trench conductive filler which is subsequently formed in contact trench 204 will be self-aligned between gate trench conductive fillers which are subsequently formed in gate trenches 206a and 206b. It is noted that the widths of the patterned openings and the distances between the adjacent patterned openings in patterned masking layer 252 can help define the dimensions of the contact and gate trenches. By controlling the appropriate dimensions (e.g., widths of the openings and the distances between the adjacent patterned openings) in patterned masking layer 252, and etching both the gate and contact trenches in the one-shot trench process using patterned masking layer 252, implementations of the present application can achieve well-controlled gate and contact trench alignment, finer cell pitch and higher cell density on semiconductor substrate 201.

Figure 2C:
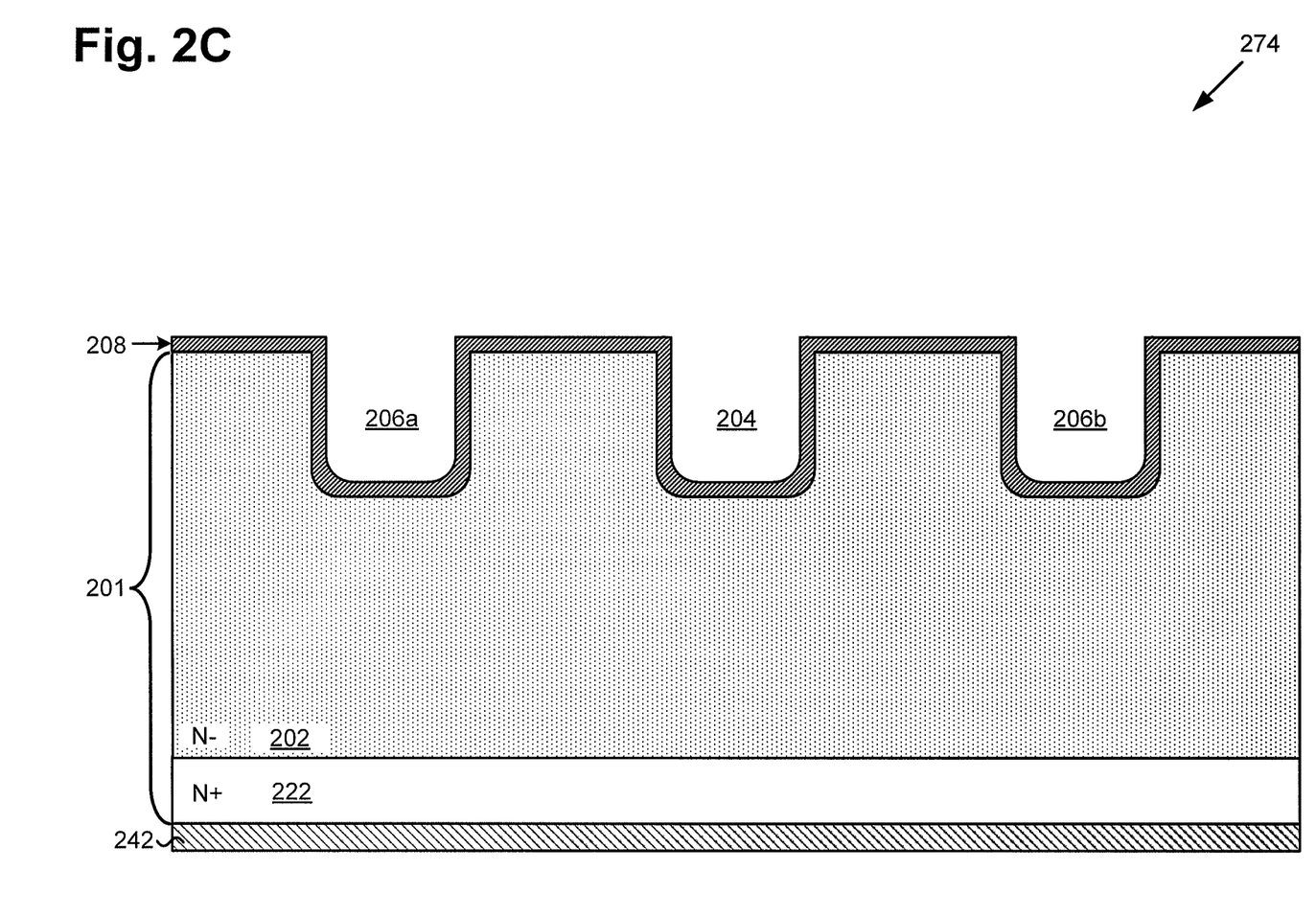
FIG. 2C illustrates a cross-sectional view of a portion of a semiconductor structure processed in accordance with an intermediate action in the flowchart of FIG. 1 according to one implementation of the present application.

Referring to action 174 in FIG. 1 and semiconductor structure 274 in FIG. 2C, action 174 includes forming a gate trench dielectric liner in the gate trench and the contact trench. Referring to FIG. 2C, semiconductor structure 274 illustrates a cross-sectional view of a portion of a semiconductor structure after completion of action 174 in flowchart 100 of FIG. 1, according to one implementation of the present disclosure. As illustrated in FIG. 2C, semiconductor structure 274 includes gate trench dielectric liner 208 over semiconductor substrate 201, in gate trenches 206a and 206b, and in contact trench 204. Gate trench dielectric liner 208 lines the respective sidewalls and bottom of gate trenches 206a and 206b. Gate trench dielectric liner 208 also lines the sidewalls and bottom of contact trench 204. In the present implementation, gate trench dielectric liner 208 includes silicon oxide (e.g., $SiO_2$). In other implementations, gate trench dielectric liner 208 may include any other suitable dielectric material. It should be noted that hard mask 250 and patterned masking layer 252 are removed from semiconductor substrate 201 before the formation of gate trench dielectric liner 208 in semiconductor structure 274.

Figure 2D:
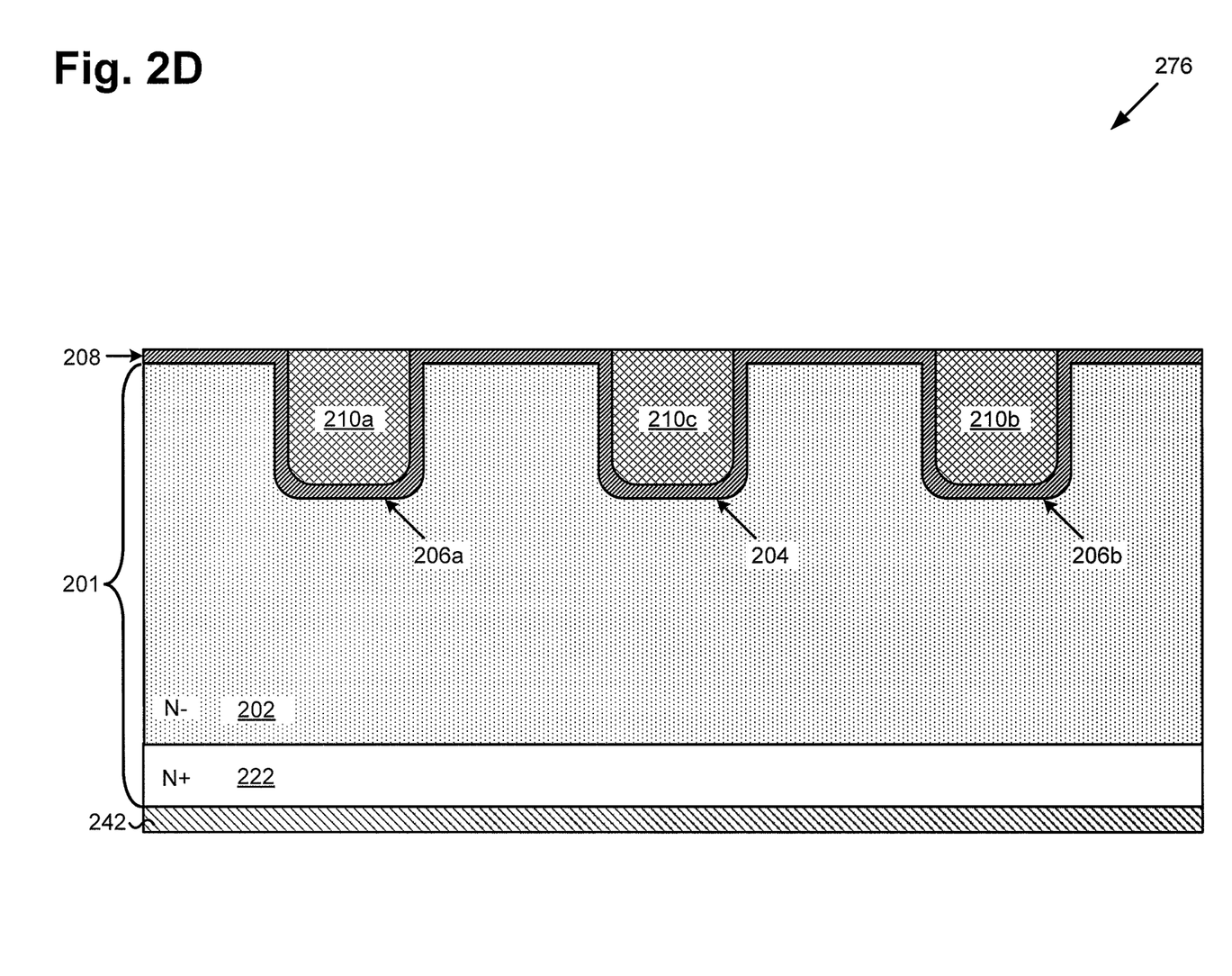
FIG. 2D illustrates a cross-sectional view of a portion of a semiconductor structure processed in accordance with an intermediate action in the flowchart of FIG. 1 according to one implementation of the present application.

Referring to action 176 in FIG. 1 and semiconductor structure 276 in FIG. 2D, action 176 includes forming gate trench conductive fillers in the gate trench and in the contact trench. Referring to FIG. 2D, semiconductor structure 276 illustrates a cross-sectional view of a portion of a semiconductor structure after completion of action 176 in flowchart 100 of FIG. 1, according to one implementation of the present disclosure. As illustrated in FIG. 2D, semiconductor structure 276 includes gate trench conductive fillers 210a and 210b in gate trenches 206a and 206b, respectively, and gate trench conductive filler 210c in contact trench 204. Gate trench conductive fillers 210a, 210b and 210c fill the entire space in each of gate trenches 206a and 206b, and contact trench 204, respectively. In the present implementation, gate trench conductive fillers 210a, 210b and 210c include doped polycrystalline silicon. In another implementation, gate trench conductive fillers 210a, 210b and 210c may include any suitable conductive material, such as metallic material. The excess portions of gate trench conductive fillers 210a, 210b and 210c, above gate trenches 206a and 206b and contact trench 204 and over gate trench dielectric liner 208, are removed by chemical mechanical polishing (CMP), such that gate trench conductive fillers 210a, 210b and 210c have a coplanar top surface with gate trench dielectric liner 208.

Figure 2E:
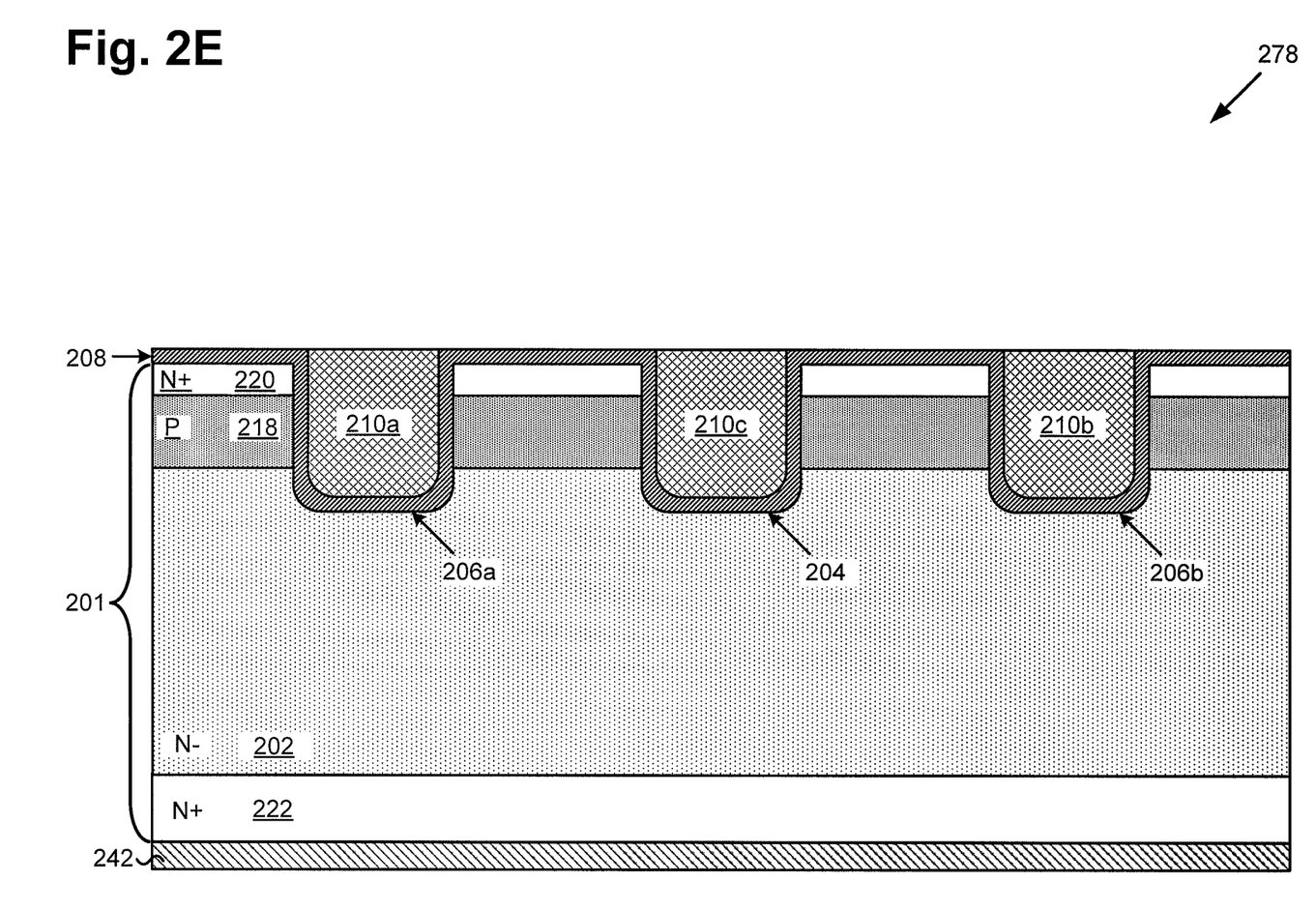
FIG. 2E illustrates a cross-sectional view of a portion of a semiconductor structure processed in accordance with an intermediate action in the flowchart of FIG. 1 according to one implementation of the present application.

Referring to action 178 in FIG. 1 and semiconductor structure 278 in FIG. 2E, action 178 includes implanting a source dopant and a body dopant to respectively form a source region and a body region in the semiconductor substrate. Referring to FIG. 2E, semiconductor structure 278 illustrates a cross-sectional view of a portion of a semiconductor structure after completion of action 178 in flowchart 100 of FIG. 1, according to one implementation of the present disclosure. As illustrated in FIG. 2E, semiconductor structure 278 includes body region 218, source region 220 in semiconductor substrate 201 above drift region 202.

In the present implementation, body region 218 may be formed by implanting a body or channel dopant into semiconductor substrate 201. As illustrated in FIG. 2E, body region 218 is situated between gate trench 206a and contact trench 204, and between contact trench 204 and gate trench 206b. In the present implementation, body region 218 is of the second conductivity type, and is shown as having P conductivity by way of example. In the present implementation, body region 218 may include a P type dopant. For example, a P type dopant, such as boron ions, may be implanted through gate trench dielectric liner 208 and into semiconductor substrate 201. In another implementation, an N type dopant, such as phosphorus or arsenic, and other appropriate implantation methods may be used to form body region 218. The implant energy and dopant concentration may vary based on the specific needs of a particular application.

In the present implementation, a source dopant is implanted through gate trench dielectric liner 208 and into semiconductor substrate 201 to form source region 220 over body region 218. For example, source region 220 is situated between gate trench 206a and contact trench 204, and between contact trench 204 and gate trench 206b, over body region 218. In the present implementation, source region 220 is of the first conductivity type, and is shown as having N+ conductivity by way of example. In the present implementation, source region 220 may include an N type dopant. For example, an N type dopant, such as phosphorus or arsenic, may be implanted through gate trench dielectric liner 208 and into semiconductor substrate 201. In another implementation, a P type dopant, such as boron, and other appropriate implantation methods may be used to form source region 220. The implant energy and dopant concentration may vary based on the specific needs of a particular application.

Figure 2F:
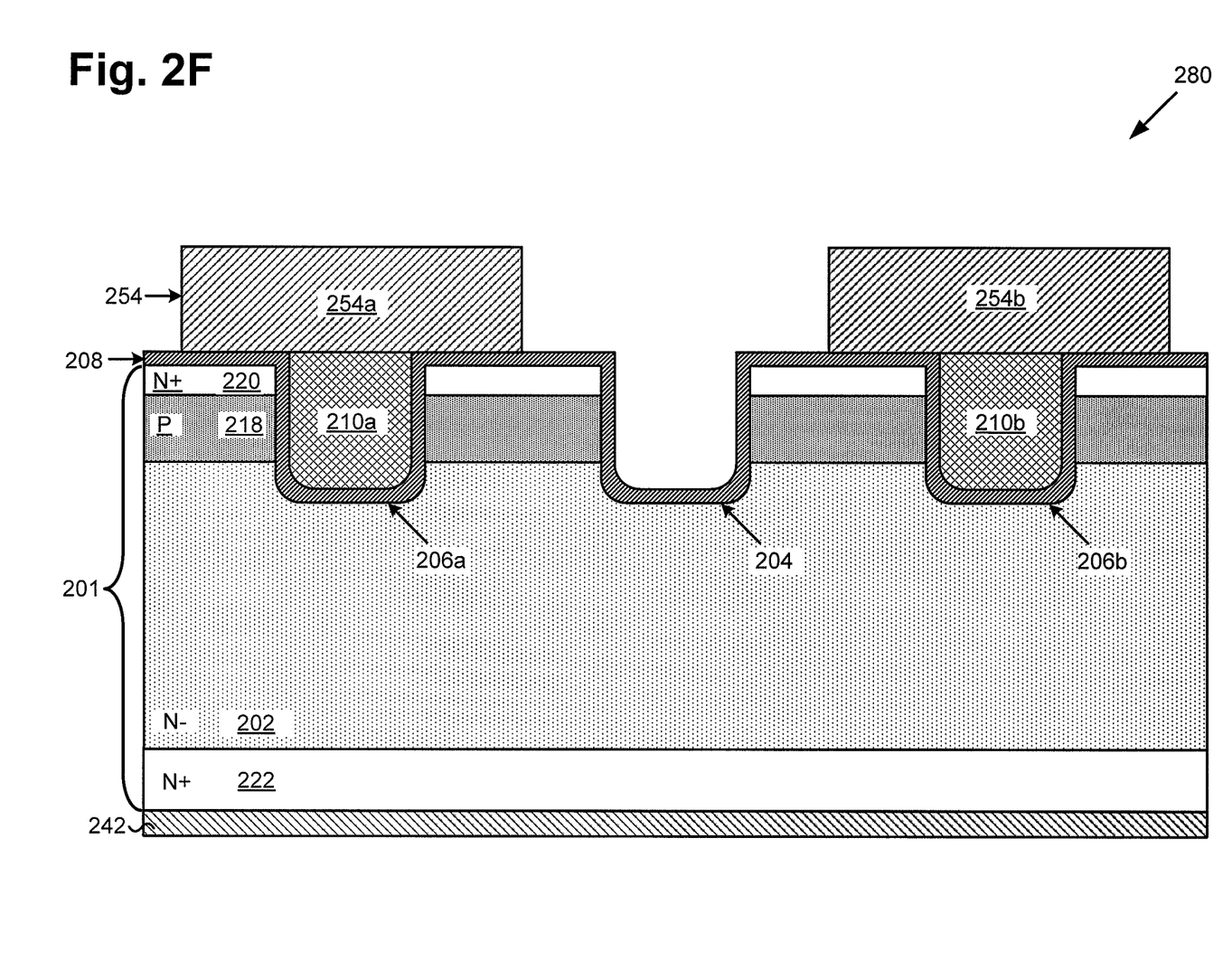
FIG. 2F illustrates a cross-sectional view of a portion of a semiconductor structure processed in accordance with an intermediate action in the flowchart of FIG. 1 according to one implementation of the present application.

Referring to action 180 in FIG. 1 and semiconductor structure 280 in FIG. 2F, action 180 includes forming a contact mask and removing the gate trench conductive filler from the contact trench. Referring to FIG. 2F, semiconductor structure 280 illustrates a cross-sectional view of a portion of a semiconductor structure after completion of action 180 in flowchart 100 of FIG. 1, according to one implementation of the present disclosure. As illustrated in FIG. 2F, semiconductor structure 280 includes contact mask 254 having portion 254a over gate trench 206a and portion 254b over gate trench 206b. Contact mask 254 is a photoresist mask covering gate trench conductive fillers 210a and 210b in gate trenches 206a and 206b, respectively. Thereafter, gate trench conductive filler 210c in contact trench 204 is removed through an etch back process, such as a gate poly etch back. After gate trench conductive filler 210c is removed from contact trench 204, gate trench dielectric liner 208 is exposed in contact trench 204.

Figure 2G:
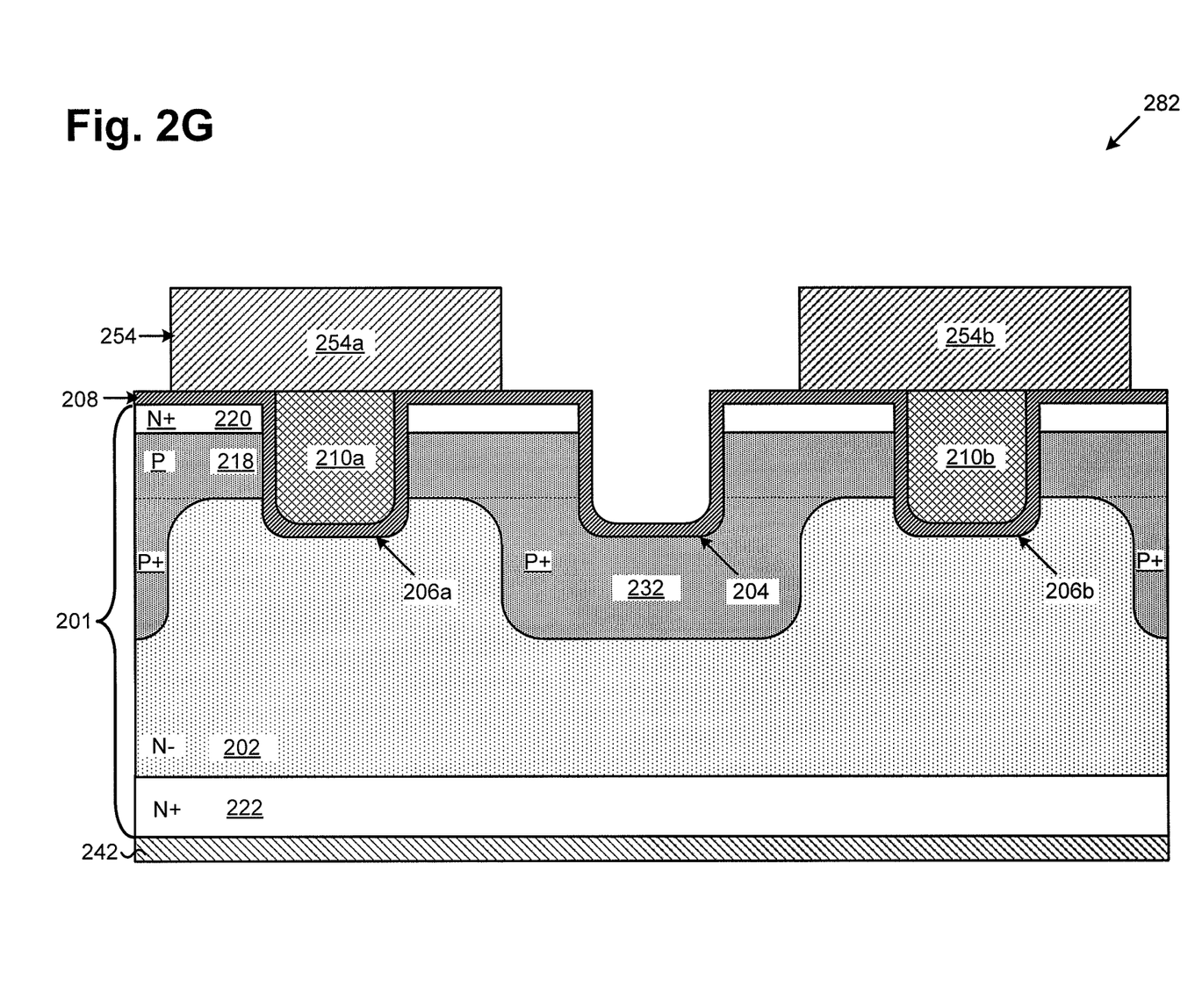
FIG. 2G illustrates a cross-sectional view of a portion of a semiconductor structure processed in accordance with an intermediate action in the flowchart of FIG. 1 according to one implementation of the present application.

Referring to action 182 in FIG. 1 and semiconductor structure 282 in FIG. 2G, action 182 includes forming a deep body region under the contact trench using the contact mask. Referring to FIG. 2G, semiconductor structure 282 illustrates a cross-sectional view of a portion of a semiconductor structure after completion of action 182 in flowchart 100 of FIG. 1, according to one implementation of the present disclosure. As illustrated in FIG. 2G, semiconductor structure 282 includes deep body region 232 under contact trench 204. In the present implementation, deep body region 232 may be formed by implanting a deep body dopant into semiconductor substrate 201 in areas not covered by contact mask 254.

Figure 2H:
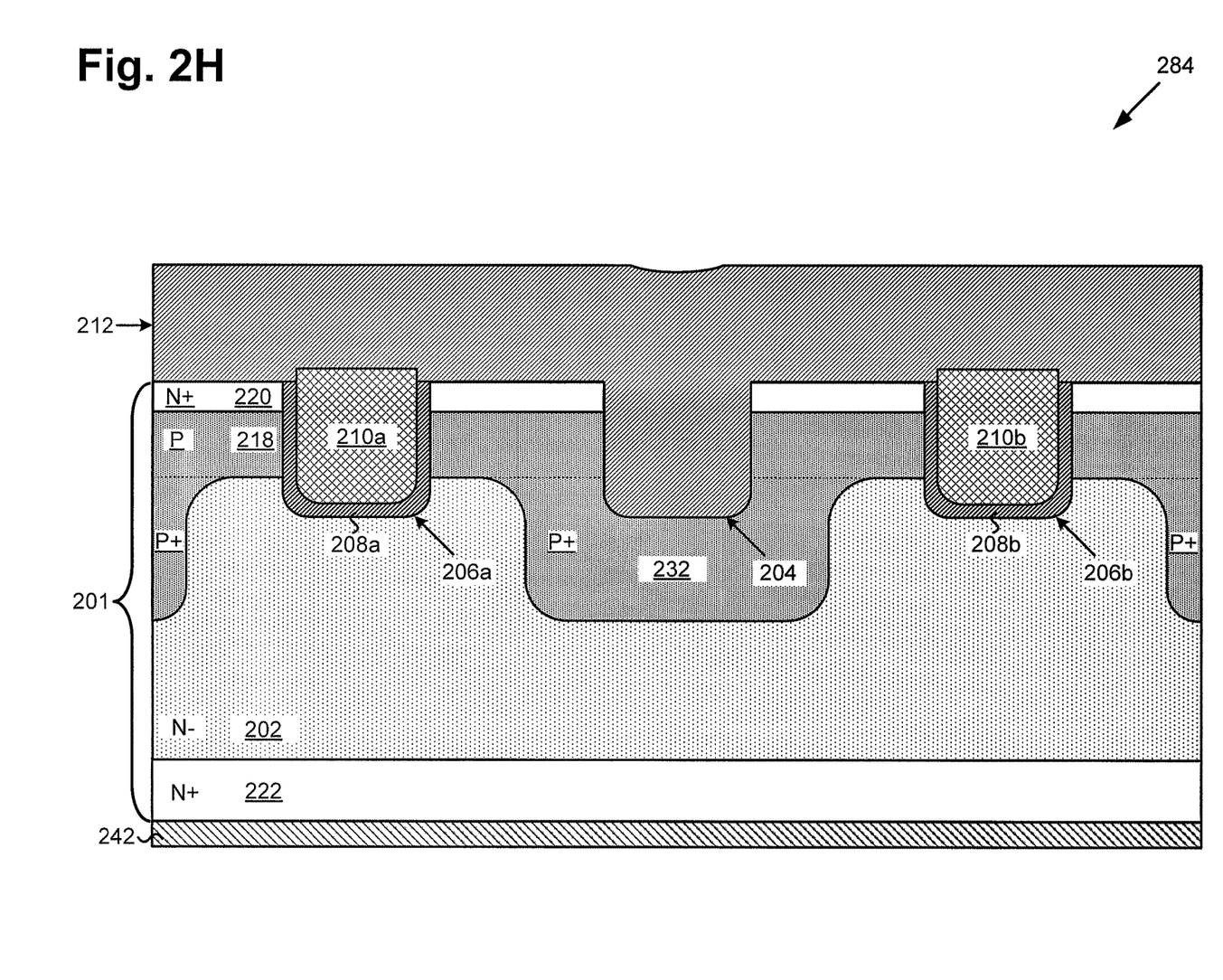
FIG. 2H illustrates a cross-sectional view of a portion of a semiconductor structure processed in accordance with an intermediate action in the flowchart of FIG. 1 according to one implementation of the present application.

As illustrated in FIG. 2G, deep body region 232 is situated below contact trench 204 and between gate trenches 206a and 206b, and extends into drift region 202. Deep body region 232 together with drift region 202 below form a p-n junction below contact trench 204 to prevent a contact trench conductive filler from directly contacting drift region 202, which would cause an electrical short between the drain and source of the semiconductor device. Deep body region 232 is also configured to remove the breakdown sites away from gate trenches 206a and 206b. In the present implementation, deep body region 232 is of the second conductivity type, and is shown as having P+ conductivity by way of example. In the present implementation, deep body region 232 may include a P type dopant. For example, a P type dopant, such as boron ions, may be implanted through gate trench dielectric liner 208 and into semiconductor substrate 201. In another implementation, N type dopant, such as phosphorus or arsenic, and other appropriate implantation methods may be used to form deep body region 232. The implant energy and dopant concentration may vary based on the specific needs of a particular application. Referring to action 184 in FIG. 1 and semiconductor structure 284 in FIG. 2G, action 184 includes removing the contact mask, removing the gate trench dielectric liner in the contact trench, and forming an interlayer dielectric layer (IDL) over the gate trench. Referring to FIG. 2H, semiconductor structure 284 illustrates a cross-sectional view of a portion of a semiconductor structure after completion of action 184 in flowchart 100 of FIG. 1, according to one implementation of the present disclosure. As illustrated in FIG. 2H, semiconductor structure 284 includes interlayer dielectric layer (IDL) 212 over semiconductor substrate 201 covering gate trench conductive fillers 210a and 210b over respective gate trenches 206a and 206b, and inside contact trench 204. In one implementation, IDL 212 includes any suitable dielectric material, such as silicon oxide or boron phosphate silicate glass (BPSG). In another implementation, IDL 212 may include silicon nitride or other suitable dielectric material. It is noted that contact mask 254 and portions of gate trench dielectric liner 208 over the top surface of semiconductor substrate 201 and inside contact trench 204 are removed from semiconductor structure 284 before the formation of IDL 212. Also, in the present implementation, after IDL 212 is deposited in semiconductor structure 284, the body dopant in body region 218, the source dopant in source region 220 and the deep body dopant in deep body region 232 may be activated through a single implant drive, thereby saving manufacturing cost and time. In another implementation, the body dopant in body region 218, the source dopant in source region 220 and the deep body dopant in deep body region 232 may be separately activated after each individual implant actions.

Figure 2I:
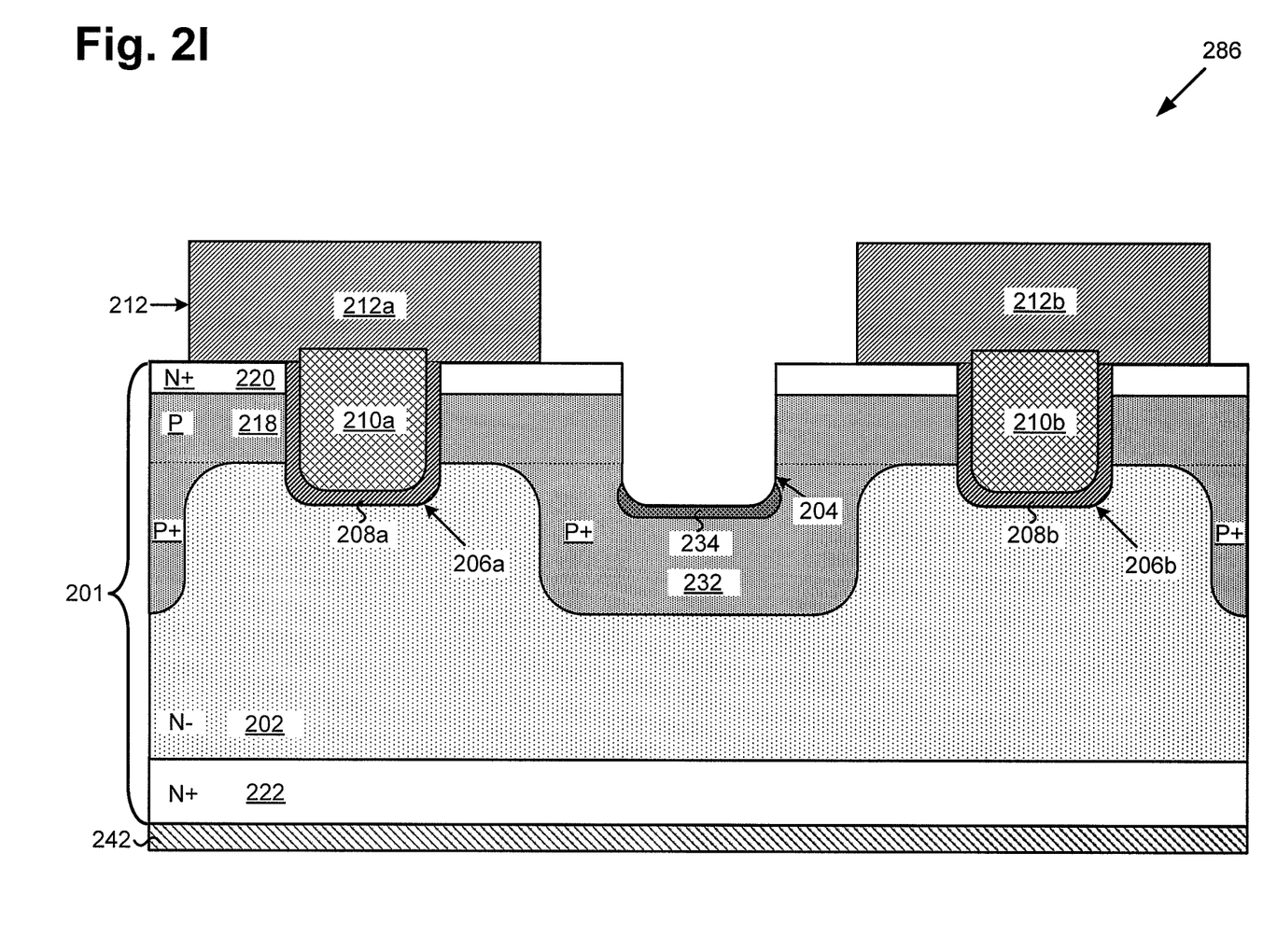
FIG. 2I illustrates a cross-sectional view of a portion of a semiconductor structure processed in accordance with an intermediate action in the flowchart of FIG. 1 according to one implementation of the present application.

Referring to action 186 in FIG. 1 and semiconductor structure 286 in FIG. 2I, action 186 includes removing the interlayer dielectric layer (IDL) in the contact trench and depositing a contact implant in the contact trench. Referring to FIG. 2I, semiconductor structure 286 illustrates a cross-sectional view of a portion of a semiconductor structure after completion of action 186 in flowchart 100 of FIG. 1, according to one implementation of the present disclosure. As illustrated in FIG. 2H, semiconductor structure 286 includes portions 212a and 212b of interlayer dielectric layer (IDL) 212 over gate trenches 206a and 206b, respectively.

It is noted that portions of IDL 212 inside contact trench 204 and adjacent to contact trench 204 are removed by, for example, a contact oxide etch using a non-critical contact mask (not explicitly shown in FIG. 2I). Thus, portions 212a and 212b of interlayer dielectric layer (IDL) 212 remain over gate trenches 206a and 206b, respectively, as gate trench dielectric caps. Thereafter, contact implant 234 is formed at the bottom of contact trench 204. For example, a P type dopant, such as boron, is implanted (e.g., 5 KeV shallow implant) at the bottom of contact trench 204 to improve the ohmic contact resistance between deep body region 232 and a contact conductive filler to be subsequently formed in contact trench 204.

Figure 2J:
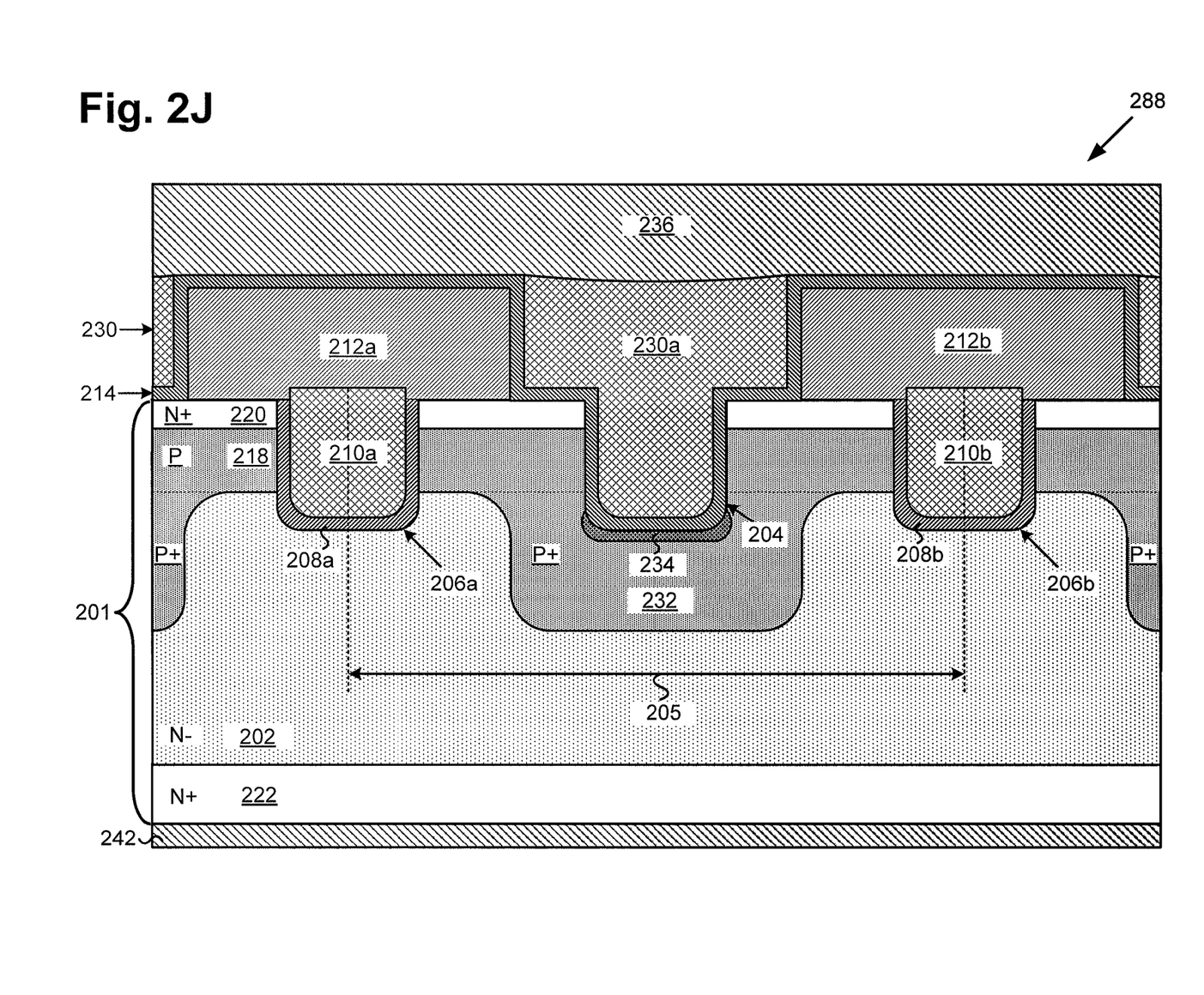
FIG. 2J illustrates a cross-sectional view of a portion of a semiconductor structure processed in accordance with a final action in the flowchart of FIG. 1 according to one implementation of the present application.

Referring to action 188 in FIG. 1 and semiconductor structure 288 in FIG. 2J, action 188 includes forming a barrier layer in the contact trench, forming a contact trench conductive filler in the contact trench, and forming a metalization layer over the contact trench. Referring to FIG. 2J, semiconductor structure 288 illustrates a cross-sectional view of a portion of a semiconductor structure after completion of action 188 in flowchart 100 of FIG. 1, according to one implementation of the present disclosure. As illustrated in FIG. 2J, semiconductor structure 288 includes barrier layer 214, contact trench conductive filler 230a in contact trench 204 and metalization layer 236 over contact trench conductive filler 230a and barrier layer 214.

As illustrated in FIG. 2J, barrier layer 214 is a conformal layer over exposed portions of semiconductor substrate 201, sidewalls and top surfaces of portions 212a and 212b of IDL 212, and lining the sidewalls and bottom of contact trench 204. In the present implementation, barrier layer 214 includes conductive material, such as titanium or titanium nitride. Thereafter, contact trench conductive filler layer 230 may be deposited in contact trench 204, the space between portions 212a and 212b of IDL 212 above semiconductor substrate 201, and over barrier layer 214. Portions of contact trench conductive filler layer 230 are polished away from semiconductor structure 288 by CMP, such that contact trench conductive filler 230a and barrier layer 214 over portions 212a and 212b of IDL 212 have a substantially coplanar top surface. In the present implementation, contact trench conductive filler 230a includes conductive material, such as tungsten. Thereafter, metalization layer 236 (e.g., source metal) is formed over contact trench conductive filler 230a and barrier layer 214. In the present implementation, metalization layer 236 includes conductive material, such as aluminum or aluminum copper alloy. It is noted that, unlike slit-gate structures having gate, source and contact trenches in a substrate, semiconductor structure 288 does not include a source trench.

As illustrated in FIG. 2J, metalization layer 236 (e.g., source metal) is situated on and electrically connected to barrier layer 214 and contact trench conductive filler 230a in contact trench 204. Drain contact layer 242 is situated below and electrically connected to drain region 222. Metalization layer 236 and drain contact layer 242 include are utilized to form a current path between drain region 222 and source region 220 during conduction of semiconductor structure 288, when a potential is applied to gate trench conductive filler 210a and/or gate trench conductive filler 210b.

As illustrated in FIG. 2J, contact trench conductive filler 230a is self-aligned in contact trench 204 between gate trenches 206a and 206b, where contact trench 204 is spaced to be substantially centered between adjacent gate trenches 206a and 206b, as a result of the single patterned masking layer utilized during actions 170 and 172 of the fabrication process, according to implementations of the present application It is noted that, in contrast to a conventional process for manufacturing trench type semiconductor devices where contact trenches are formed several processing actions after gate conductive fillers are formed in gate trenches, implementations of the present application use a single patterned masking layer to etch both the gate and contact trenches in a one-shot trench process. Because gate trenches 206a and 206b and contact trench 204 are formed in a single processing action, misalignments between the gate and contact trenches can be effectively eliminated, such that contact trench conductive filler 230a in contact trench 204 is self-aligned between gate trench conductive filler 210a in gate trench 206a and gate trench conductive filler 210b in gate trench 206b. Since the widths of the patterned openings and the distances between the adjacent patterned openings in patterned masking layer 252 can help define the dimensions of gate trenches 206a and 206b and contact trench 204, by controlling the appropriate dimensions (e.g., widths of the openings and the distances between two adjacent openings) in patterned masking layer 252, and etching both the gate and contact trenches in the one-shot trench process using patterned masking layer 252, semiconductor structure 288 can achieve well-controlled gate and contact trench alignment, finer cell pitch and higher cell density on semiconductor substrate 201. For example, cell pitch 205 which is measured from the center of gate trench conductive filler 210a in gate trench 206a and the center of gate trench conductive filler 210b in gate trench 206b is equal to or less than 0.6 microns. In addition, implementations of the present application enable enhanced electrical performance characteristics, such as lower $R_{DSon}$, and lower voltage nodes for semiconductor devices, such as MOSFETs, IGBTs, and the like.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A method of forming a semiconductor device, said method comprising:
   forming a gate trench and a contact trench concurrently in a semiconductor substrate using a patterned masking layer such that a depth of the gate trench is substantially identical to a depth of the contact trench;
   forming a gate conductive filler in said gate trench;
   forming a deep body region directly below said contact trench;
   forming a contact conductive filler in said contact trench;
   forming a body region directly adjacent to the gate trench, wherein the body region and the deep body region each have the same conductivity type and form a p-n junction with a subjacent drift region within the substrate,
   wherein the p-n junction between the deep body region and the drift region is below bottoms of the gate and contact trenches, and
   wherein the p-n junction between the body region and the drift region is above bottoms of the gate and contact trenches.

2. The method of claim 1 further comprising forming an interlayer dielectric layer (IDL) over said gate conductive filler.

3. The method of claim 1 further comprising forming a contact implant at directly below a bottom of said contact trench, the contact implant having the same conductivity type and a higher dopant concentration than the deep body region.

4. The method of claim 1 further comprising forming a barrier layer in said contact trench.

5. The method of claim 1 further comprising forming and a source region in said semiconductor substrate.

6. The method of claim 1 wherein said gate conductive filler comprises doped polycrystalline silicon.

7. The method of claim 1 wherein said contact conductive filler comprises tungsten.

8. The method of claim 1 further comprising forming a metalization layer over the contact trench.

9. The method of claim 1 wherein said gate trench extends through a source region and the body region, and into a drift region of said semiconductor substrate.

10. The method of claim 1 wherein said semiconductor device comprises a MOSFET.

11. The method of claim 1 wherein said semiconductor device comprises an IGBT.

12. The method of claim 1 wherein said semiconductor device has a cell pitch of equal to or less than 0.6 microns.

13. The method of claim 1, further comprising,
   forming a dielectric liner that lines sidewalls of the gate trench and the contact trench, wherein the dielectric liner is formed immediately after forming the gate trench and the contact trench, and
   wherein the gate conductive filler is formed immediately after forming the dielectric liner.

14. The method of claim 13, further comprising,
   performing a planarization step after forming the gate conductive filler such that the gate conductive filler has an upper surface that is coplanar with the dielectric liner, and
   forming a body region and a source region immediately after performing the planarization step.

* * * * *

UNITED STATES PATENT AND TRADEMARK OFFICE
CERTIFICATE OF CORRECTION

PATENT NO. : 10,403,712 B2  
APPLICATION NO. : 15/171164  
DATED : September 3, 2019  
INVENTOR(S) : Ma Page 1 of 1

It is certified that error appears in the above-identified patent and that said Letters Patent is hereby corrected as shown below:

In the Claims

Column 9, Line 28 (Claim 2, Line 1), please change "claim 1 further" to – claim 1, further –

Column 9, Line 31 (Claim 3, Line 1), please change "claim 1 further" to – claim 1, further –

Column 9, Line 32 (Claim 3, Line 2), please change "at directly" to – directly –

Column 10, Line 1 (Claim 4, Line 1), please change "claim 1 further" to – claim 1, further –

Column 10, Line 3 (Claim 5, Line 1), please change "claim 1 further" to – claim 1, further –

Column 10, Line 5 (Claim 6, Line 1), please change "claim 1 wherein" to – claim 1, wherein –

Column 10, Line 7 (Claim 7, Line 1), please change "claim 1 wherein" to – claim 1, wherein –

Column 10, Line 9 (Claim 8, Line 1), please change "claim 1 further" to – claim 1, further –

Column 10, Line 11 (Claim 9, Line 1), please change "claim 1 wherein" to – claim 1, wherein –

Column 10, Line 14 (Claim 10, Line 1), please change "claim 1 wherein" to – claim 1, wherein –

Column 10, Line 16 (Claim 11, Line 1), please change "claim 1 wherein" to – claim 1, wherein –

Column 10, Line 18 (Claim 12, Line 1), please change "claim 1 wherein" to – claim 1, wherein –

Signed and Sealed this  
Twenty-second Day of October, 2019

Andrei Iancu  
*Director of the United States Patent and Trademark Office*